United States Patent
Gao et al.

(10) Patent No.: US 11,158,606 B2
(45) Date of Patent: Oct. 26, 2021

(54) MOLDED DIRECT BONDED AND INTERCONNECTED STACK

(71) Applicant: Invensas Bonding Technologies, Inc., San Jose, CA (US)

(72) Inventors: Guilian Gao, San Jose, CA (US); Cyprian Emeka Uzoh, San Jose, CA (US); Jeremy Alfred Theil, Mountain View, CA (US); Belgacem Haba, Saratoga, CA (US); Rajesh Katkar, Milpitas, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 96 days.

(21) Appl. No.: 16/460,068

(22) Filed: Jul. 2, 2019

(65) Prior Publication Data

US 2020/0013754 A1   Jan. 9, 2020

Related U.S. Application Data

(60) Provisional application No. 62/694,845, filed on Jul. 6, 2018.

(51) Int. Cl.
*H01L 25/065* (2006.01)
*H01L 21/768* (2006.01)
(Continued)

(52) U.S. Cl.
CPC .... *H01L 25/0657* (2013.01); *H01L 21/76898* (2013.01); *H01L 23/5384* (2013.01);
(Continued)

(58) Field of Classification Search
CPC . H01L 2225/06555; H01L 2225/06513; H01L 2225/0652; H01L 2225/06541; H01L 2225/06548; H01L 25/0657; H01L 21/76898; H01L 2224/81895; H01L 2224/81894; H01L 23/5384–5386; H01L 24/95
See application file for complete search history.

(56) References Cited

U.S. PATENT DOCUMENTS 5,753,536 A   5/1998 Sugiyama et al.
5,771,555 A   6/1998 Eda et al.
(Continued)

FOREIGN PATENT DOCUMENTS

| JP | 2013-33786 A | 2/2013 |
|---|---|---|
| JP | 2018-160519 A | 10/2018 |
| WO | 2005-043584 A2 | 5/2005 |

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
(Continued)

*Primary Examiner* — Jose R Diaz

(57) ABSTRACT

Dies and/or wafers are stacked and bonded in various arrangements including stacks, and may be covered with a molding to facilitate handling, packaging, and the like. In various examples, the molding may cover more or less of a stack, to facilitate connectivity with the devices of the stack, to enhance thermal management, and so forth.

35 Claims, 12 Drawing Sheets

(51) Int. Cl.
*H01L 23/538* (2006.01)
*H01L 23/00* (2006.01)

(52) U.S. Cl.
CPC ...... *H01L 23/5385* (2013.01); *H01L 23/5386* (2013.01); *H01L 24/95* (2013.01)

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 9,093,350 B2 | 7/2015 | Endo et al. | |
| 9,142,517 B2 | 9/2015 | Liu | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,960,142 B2 | 5/2018 | Chen et al. | |
| 10,026,605 B2 | 7/2018 | Doub et al. | |
| 9,953,941 B2 | 8/2018 | Enquist | |
| 10,075,657 B2 | 9/2018 | Fahim et al. | |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2006/0057945 A1 | 3/2006 | Hsu et al. | |
| 2007/0007639 A1 | 1/2007 | Fukazawa | |
| 2007/0111386 A1 | 5/2007 | Kim et al. | |
| 2008/0036082 A1 | 2/2008 | Eun et al. | |
| 2012/0077314 A1 | 3/2012 | Park et al. | |
| 2013/0169355 A1* | 7/2013 | Chen | H01L 23/60 |
| | | | 327/564 |
| 2014/0175655 A1 | 6/2014 | Chen et al. | |
| 2015/0064498 A1 | 3/2015 | Tong | |
| 2015/0235949 A1* | 8/2015 | Yu | H01L 21/76802 |
| | | | 257/774 |
| 2016/0343682 A1 | 11/2016 | Kawasaki | |
| 2018/0006006 A1 | 1/2018 | Kim et al. | |
| 2018/0158749 A1 | 6/2018 | Yu et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |
| 2019/0371763 A1 | 12/2019 | Agarwal et al. | |

OTHER PUBLICATIONS

Moriceau, H. et al., "Overview of Recent Direct Wafer Bonding Advances and Applications", Advances in Natural Sciences-Nanoscience and Nanotechnology, 2010, 12 pages.
Nakanishi, H. et al., "Studies on $SiO_2$—$SiO_2$ Bonding with Hydrofluoric Acid. Room Temperature and Low Stress Bonding Technique for MEMS," Tech. Research Lab., 200, Elsevier Science S.A., 8 pages.
Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.
Plobi et al., "Wafer Direct Bonding: Tailoring Adhesion Between Brittle Materials," Materials Science and Engineering Review Journal, 1999, 88 pages.
International Search Report and Written Opinion for PCT/US2019/040391, dated Oct. 25, 2019, 12 pages.

\* cited by examiner

MOLDED DIRECT BONDED AND INTERCONNECTED STACK

PRIORITY CLAIM AND CROSS-REFERENCE TO RELATED APPLICATION

This application claims the benefit under 35 U.S.C. § 119(e)(1) of U.S. Provisional Application No. 62/694,845, filed Jul. 6, 2018, which is hereby incorporated by reference in its entirety.

FIELD

The following description relates to processing of integrated circuits ("ICs"). More particularly, the following description relates to techniques for packaging dies or wafers, and other microelectronic assemblies.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company. The direct dielectric bonding techniques include a spontaneous covalent bonding process that takes place at ambient conditions when two prepared dielectric surfaces are brought together, without adhesive or an intervening material, and the hybrid bonding technique adds direct metal-to-metal bonds of respective metallic bond pads at the bonding surfaces of the respective dies or wafers, also without an intervening material, forming unified conductive structures (see for example, U.S. Pat. Nos. 6,864,585 and 7,485,968, which are incorporated herein in their entirety). Heated annealing of the metallic bond pads may be used to augment the metal-to-metal bonds.

Respective mating surfaces of the bonded dies or wafers often include embedded conductive interconnect structures (which may be metal), or the like. In some examples, the bonding surfaces are arranged and aligned so that the conductive interconnect structures from the respective surfaces are joined during the bonding. The joined interconnect structures form continuous conductive interconnects (for signals, power, etc.) between the stacked dies or wafers.

There can be a variety of challenges to implementing stacked die and wafer arrangements. When bonding stacked dies or wafers using a direct bonding or hybrid bonding technique, it is usually desirable that the surfaces of the dies or wafers to be bonded be extremely flat, smooth, and clean. For instance, in general, the surfaces should have a very low variance in surface topology (i.e., nanometer scale variance), so that the surfaces can be closely mated to form a lasting bond.

Double-sided dies or wafers can be formed and prepared for stacking and bonding, where both sides of the dies or wafers will be bonded to other substrates, wafers, or dies, such as with multiple die-to-die or die-to-wafer applications. Preparing both sides of the die or wafer includes finishing both surfaces to meet dielectric roughness specifications and metallic layer (e.g., copper, etc.) recess specifications. The hybrid surface may be prepared for bonding with another die, wafer, or other substrate using a chemical mechanical polishing (CMP) process, plasma processes, wet and dry cleaning methods, or the like.

It may be desirable to package stacked and bonded dies and wafers in various configurations for diversity of connectivity, performance optimization, and enhanced thermal management.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative techniques and devices are disclosed, including process steps for stacking and bonding dies and/or wafers, including hybrid bonding dies to dies, dies to wafers, and wafers to wafers without adhesive. In various embodiments, the dies and/or wafers are stacked and bonded in various arrangements including stacks, and may be covered with a molding to facilitate handling, packaging, and the like. In various examples, the molding may cover more or less of a stack, to facilitate connectivity with the devices of the stack, to enhance thermal management, and so forth.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, passive elements, MEMS (Micro-Electro Mechanical Systems) components, packaged components, structures (e.g., wafers, panels, boards, PCBs, etc.), and the like, that may be integrated and coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

Example Embodiments

Figure 1:
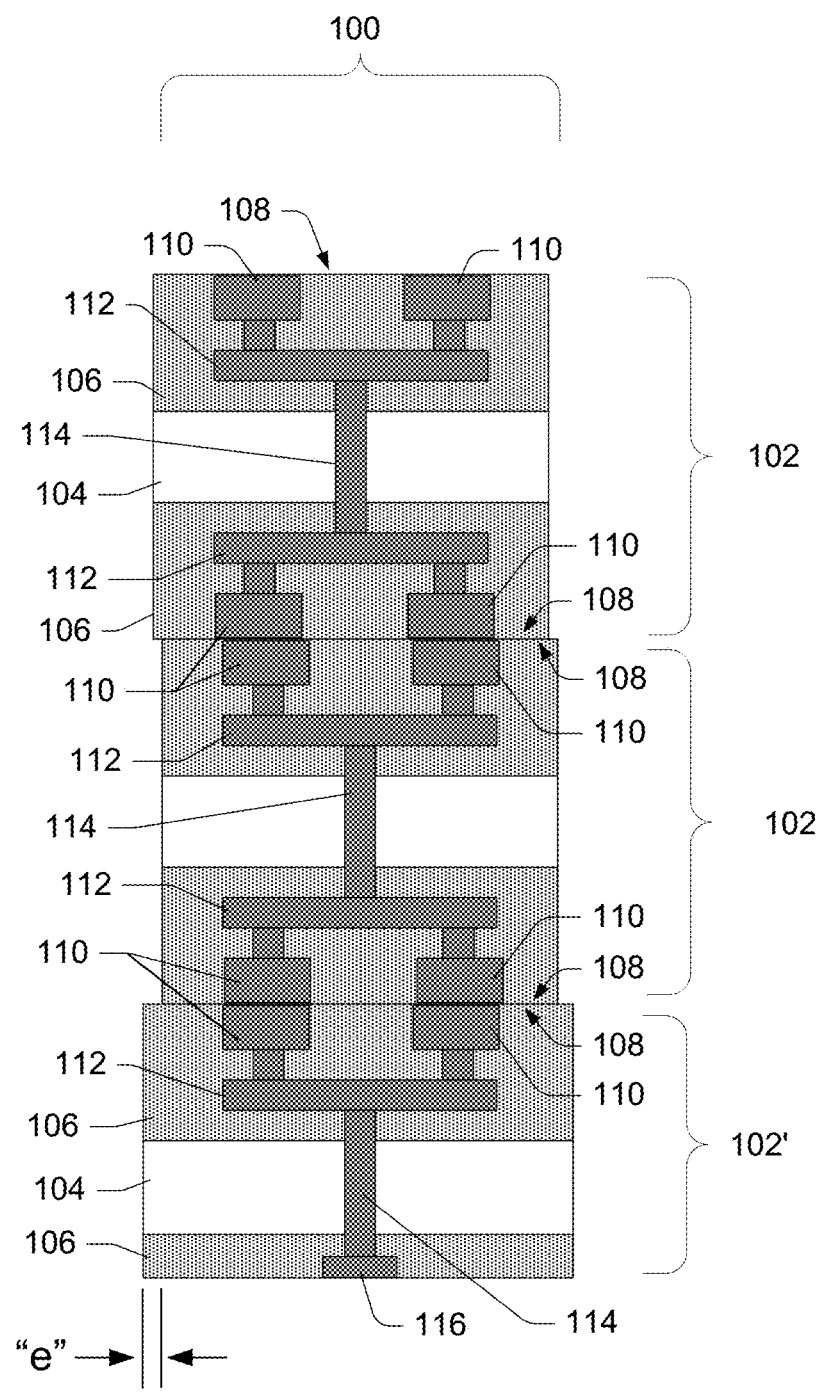
FIG. 1 is a cross-sectional profile view of example die-to-wafer and/or die-to-die stacking and molding, according to an embodiment.

FIG. 1 is a cross-sectional profile view of example die-to-wafer and/or die-to-die stacking and molding, according to an embodiment. In the example shown, a stack 100 (or microelectronic assembly 100) is formed by stacking and bonding (hybrid bonding without adhesive, for example) a plurality of dies 102 (e.g., any quantity of dies 102 desired). In an alternative embodiment, the stack 100 is formed by stacking and bonding (hybrid bonding without adhesive, for example) a plurality of wafers, which are then singulated into the dies 102 shown in FIG. 1. In an implementation, as shown in FIG. 1, the dies 102 may not be perfectly aligned in the stack 100. In other words, the edges of the dies 102 are not lined up exactly, and there is some error or misalignment "e" from one die 102 to another die 102 of the stack 100. In various examples, the misalignment "e" may be due to an accuracy tolerance of a pick and place tool, or the like.

Dies 102 (or wafers) may be formed using various techniques, to include a base substrate 104 and one or more insulating or dielectric layers 106. For example, the dies 102 shown at FIG. 1 may represent double-sided dies 102, having an insulating layer 106 on both surfaces of the base layer 104. Also included may be dies 102', as also shown in FIG. 1, which may be single-sided or double-sided host dies or wafers. Single-sided dies 102 or 102' may be positioned in the stack 100 as the top die 102, the bottom die 102, or as any other die 102 in the stack 100 where direct-bond connectivity to both sides of the die 102 is not desired. The reference "die 102" as used herein includes both single and double-sided dies and wafers, unless otherwise specified.

The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like.

Bonding surfaces 108 of the die 102 can include conductive features 110, such as TSVs, traces, pads, and interconnect structures, for example, embedded into the insulating layer 106 and arranged so that the conductive features 110 from respective bonding surfaces 108 of opposing devices can be mated and joined during bonding, if desired. The joined conductive features 110 can form continuous conductive interconnects (for signals, power, ground, etc.) between stacked devices.

Damascene processes (or the like) may be used to form the embedded conductive features 110 in the insulating layer 106. The conductive features 110 may be comprised of metals (e.g., copper, etc.) or other conductive materials, or combinations of materials, and include structures, traces, pads, patterns, and so forth. In some examples, a barrier layer may be deposited in the cavities for the conductive features 110 prior to depositing the material of the conductive features 110, such that the barrier layer is disposed between the conductive features 110 and the insulating layer 106. The barrier layer may be comprised of tantalum, titanium, tungsten layer or their combination with their various respective compounds or alloys, for example, or another conductive material, to prevent or reduce diffusion of the material of the conductive features 110 into the insulating layer 106. After the conductive features 110 are formed, the exposed surfaces of the device wafer 102, including the insulating layer 106 and the conductive features 110 can be planarized (e.g., via CMP) to form the flat bonding surfaces 108.

Forming a bonding surface 108 includes finishing the surface 108 to meet dielectric roughness specifications and metallic layer (e.g., copper, etc.) recess specifications (if specified), to prepare the surface 108 for hybrid bonding. In other words, the bonding surface 108 is formed to be as flat and smooth as possible, with very minimal (nanometer scale) surface topology variance. Various conventional processes, such as chemical mechanical polishing (CMP), dry or wet etching, and so forth, may be used to achieve the low surface roughness. This process provides the flat, smooth surface 108 that results in a reliable bond.

Embedded conductive traces 112 that extend partially into the dielectric substrate 106 below the prepared surface 108 may be used to electrically couple the conductive features 110 to desired components throughout the die 102. For instance, the conductive features 110 may be coupled to conductive (e.g., copper) through-silicon vias (TSVs) 114 or the like, that extend partly or fully through the die 102 to make electrical connections through the thickness of the die 102. For instance, a TSV 114 may extend about 50 microns in some cases, depending on the thickness of the die 102. The figures show examples of dies 102 with various arrangements of conductive features 110, traces 112, and TSVs 114 that are not intended to be limiting. In various embodiments, some of the conductive features 110, traces 112, and TSVs 114 may not be present in a die 102 (or wafer) and in other embodiments, additional conductive features 110, traces 112, and TSVs 114 may be present, or other circuit components, and the like.

Dies 102 may be hybrid bonded, for instance, without adhesive to other dies 102 having metal pads 110, traces 112, and/or TSVs 114, to make the desired electrical connections through the dies 102 while forming the stack 100. Hybrid bonding includes direct dielectric-to-dielectric bonding, without an adhesive or other intervening material, of the respective insulating layers 106 of each die 102 (e.g., ZIBOND®), as well as direct metal-to-metal bonding, also without an intervening material, of the respective conductive features 110 of each die 102 (e.g., DBI®). The dielectric-to-dielectric bonding occurs spontaneously as the respective bonding surfaces 108 are brought together at ambient temperatures. The metal-to-metal bonding (which may include diffusion between the metal of the conductive features 10) can occur with the aid of heat, with or without pressure.

As shown in FIG. 1, electrical connectivity may be established from the top surface of the top die 102 of the stack 100 (e.g., through conductive features 110), through the dies 102 (any number of dies 102) of the stack 100 (e.g., through conductive features 110, traces 112, and TSVs 114), and to the bottom surface of the bottom die 102 of the stack 100 (e.g., through a TSV 114). In the example of FIG. 1, conductive features 110 provides connectivity to the top surface of the stack 100 and a TSV 114 with at least one electrically coupled pad 116 provides connectivity to the bottom surface of the bottom die 102 of the stack 100 (in some cases, a titanium layer (not shown), or the like, may couple the TSV 114 to the pad 116). In alternate embodiments, one or both of the top and bottom surfaces of the stack 100 may not have connectivity or different components than shown may provide the connectivity to the top or bottom surfaces of the stack 100. For instance, in some embodiments, the stack 100 may not include conductive features 110 at the top surface of the stack 100 or TSVs 114 in the top die 102 or TSVs 114 and pads 116 in the bottom die 102.

In some implementations, one or more of the TSVs 114 provide thermal connectivity between the dies 102. For instance, the TSVs can help to dissipate or transmit heat from some dies 102 to other dies 102 and/or to the outside environment. In the implementations, the TSVs 114 are comprised of a thermally conductive material, and may include a thermally conductive barrier layer (not shown). In some examples, the TSVs 114 may be sized for optimal thermal dissipation, based on the function (e.g., heat generation) of the associated dies 102.

Figure 2:
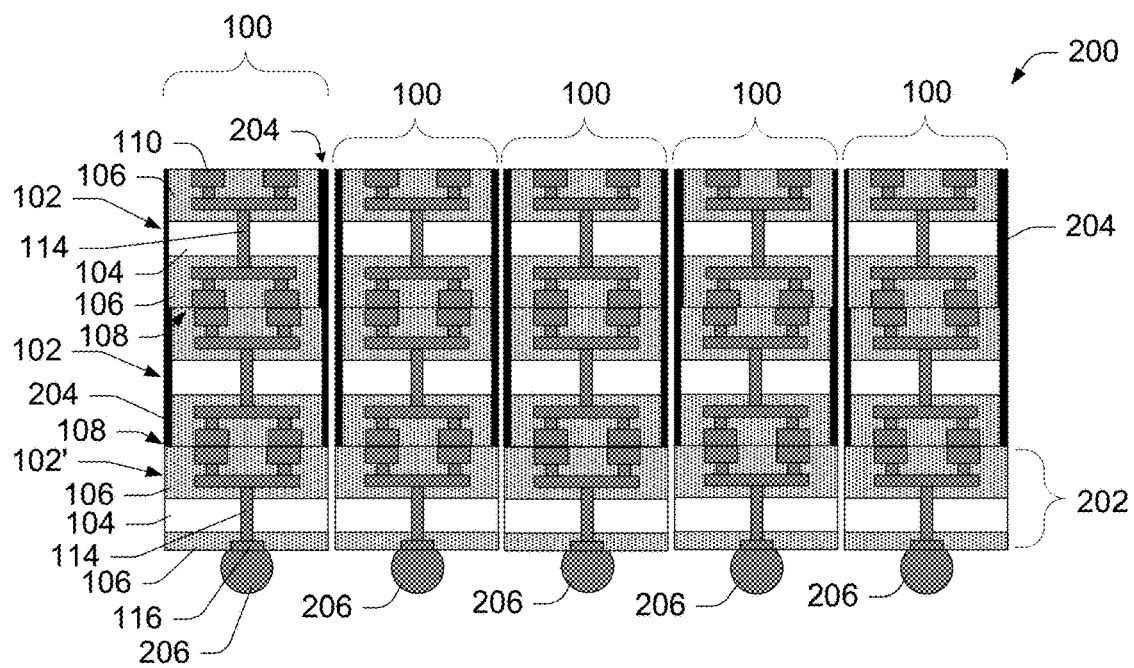
FIG. 2 is a cross-sectional profile view of example die-to-wafer and/or die-to-die stacking and molding, according to an embodiment wherein the top of the stacks is not covered.

FIG. 2 is a cross-sectional profile view of a microelectronic assembly 200, comprising multiple stacks 100 of dies 102. In some embodiments, each stack 100 includes the same quantity of dies 102. In other embodiments, some stacks 100 may include a different quantity of dies 102 than other stacks 100 of the assembly 200. In an implementation, as shown in FIG. 2, the dies 102 are not perfectly aligned in the stacks 100. In other words, the edges of the dies 102 are not lined up exactly within the stacks 100, and there is some error or misalignment of the edges from die 102 to die 102. In some embodiments, the stacks 100 are singulated from a plurality of wafers, which have been stacked and bonded as discussed above.

In an implementation, the bottom set of dies 102' comprise a host wafer 202 for the stacks 100. In the implementation, the dies 102 can be stacked onto the host wafer 202, which is then singulated at borders of the stacks 100 if desired. In other implementations, the host wafer 202 may be singulated at a different stage in the process, if at all.

As shown in FIG. 2, one or more of the stacks 100 of the assembly 200 may be covered in molding 204 comprising an encapsulant, or the like. In various embodiments, the molding 204 may comprise a high strength, high thermal stress (high heat resistant) encapsulant material, that may also have a high heat dissipation characteristic. Further, it may be desirable for the molding 204 to have a coefficient of thermal expansion (CTE) of less than 20, to assist with warpage control. For instance, HITACHI® provides such an encapsulant or "epoxy molding compound," referred to as "CEL." Other like products are also commercially available. In one embodiment, the assembly 200 is covered with the molding 204, then the assembly 200 is diced into the multiple stacks 100. The individual stacks 100 may be covered with additional encapsulant 204 as desired. In other embodiments, the stacks 100 are molded after formation of the stacks 100, including stacking and bonding individual dies 102 into the stacks 100 or singulation of wafers to form the dies 102 and stacks 100. For example, the molding 204 may be deposited before or after singulation of the dies 102. In either case, the molding 204 can cover the entire stack 100 of dies 102 or selected dies 102. For instance, in an embodiment, the host wafer 202 (and the dies 102') may not be covered with the molding 204. This may be due to the manufacturing process or by design.

For all of the implementations disclosed herein, the molding 204 may be comprised of a single layer of encapsulant covering over and/or around some or all of the dies 102 of a stack 100, or the molding 204 may be comprised of multiple layers (e.g., laminate) of encapsulant of the same or of different materials. Further, in an implementation, the molding 204 comprises particles within the encapsulant, and the molding 204 has a progression of density of the particles—from a state of low or no particles at the top or the bottom of the stack 100 to a state of higher density of particles at the other of the top or the bottom of the stack 100. In one example, the particles may be present at different densities in multiple layers of encapsulant, when present. In various embodiments, the molding 204 comprises an inorganic casing, or the like.

In some examples, adding the molding 204 to the stacks 100 of dies 102 and/or to the assembly 200 provides a final packaging to the stacks 100 or to the assembly 200. The stack solution allows ease of handling during processing and assembly, as well as for deployment in an application. The molding 204 provides protection to the dies 102 and stacks 100 as well as the assembly 200 and any discrete components that may be packaged with the dies 102.

In an implementation, as shown at FIG. 2, the top surface of one or more of the stacks 100 (or all of the stacks 100) may be free from molding 204. The bare top surface of the top dies 102 can be used for further interconnection of the top dies 102 of the stack 100 to other circuits, devices (e.g., optical, radio frequency (RF), analog, digital, logic, memory, or other devices), or the like (e.g., when conductive features 110 are present at the top surface of the top die 102), including additional dies 102 or assemblies 200, for example. Alternately or additionally, the top surface of the top dies 102 may be uncovered to enhance thermal dissipation. For instance, heat may dissipate from the dies 102 more readily and efficiently without the encapsulant 204 at the top surface of the top dies 102 of the assembly 200. In such cases, the conductive features 110 (as well as the traces 112) may not be present at the top surface of the top dies 102. The TSVs 114 may be present if they are used to help dissipate heat through the top surface, for instance.

In an implementation, the assembly 200 includes one or more electrical contacts or terminals 206 at a surface (such as the bottom surface, for instance) of the assembly 200. The terminals 206 may be used for electrically coupling the assembly to another circuit, device, printed circuit board (PCB), or the like. As shown in FIG. 2, the terminals 206 may be electrically coupled to the TSV 114 (or other interconnection) of the dies 102 (such as the bottom-most dies 102) of the stacks 100 of the assembly 200 through the pads 116. For instance, the assembly 200 may include electrical connectivity from the top dies 102 (e.g., the top surface of the top dies 102 in some cases) of one or more of the stacks 100 through the dies 102 of the stacks 100, to the terminals 206.

In some embodiments, additional layers, circuit components, vias, and the like may also be incorporated into the stacks 100 and/or the assembly 200 as desired. TSVs 114 may be optional in some dies 102 and/or in some stacks 100 in alternate implementations.

Figure 3:
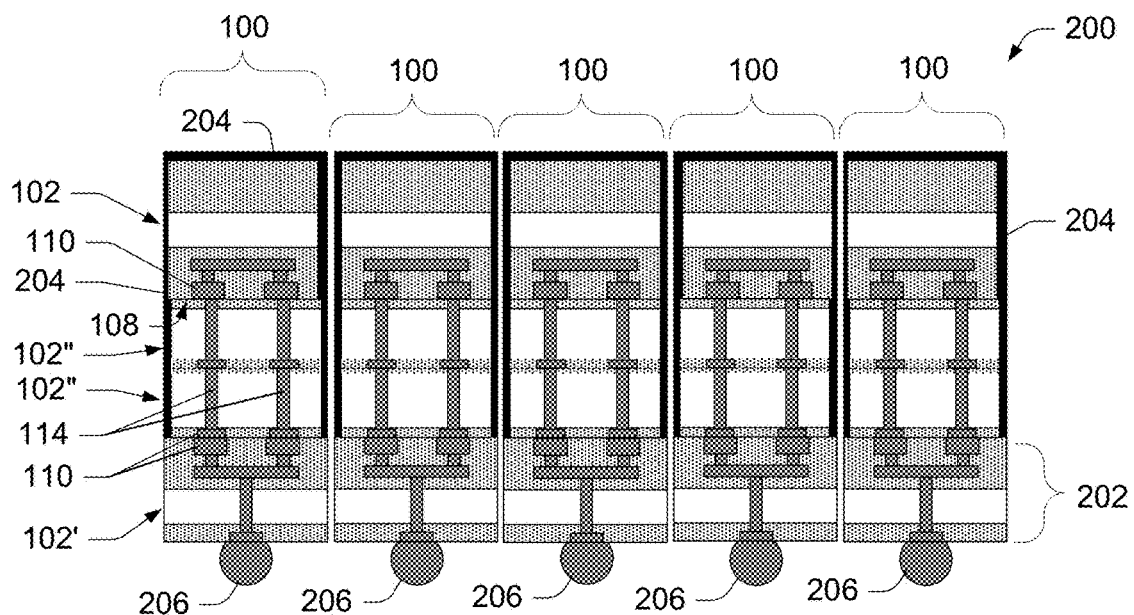
FIG. 3 is a cross-sectional profile view of example die-to-wafer and/or die-to-die stacking and molding, according to an embodiment wherein the top of the stacks is covered.

In an implementation, as shown at FIG. 3, the top surface of one or more of the stacks 100 (or all of the stacks 100) may include molding 204. In the implementation, the molding 204 at the top surface of the stacks 100 and the assembly 200 protects the stacks 100 and the assembly 200 during handling, assembly, deployment, and so forth. In an embodiment, each of the stacks 100 is individually covered with the molding 204, including the top and sides of the stack 100. In an embodiment, the host wafer 202 (and the dies 102') may not be covered with the molding 204. As shown in the example of FIG. 3, in some embodiments, the top dies 102 of an assembly 200 may not include conductive features 110 (or traces 112 and/or TSVs 114) when no electrical connections are to be made at the top surface of the dies 102 and the assembly 200. These components may be optional, for instance when they are used for other purposes (e.g., when circuit components are disposed on or within the upper insulating layer 106, or the like).

As also shown in the example of FIG. 3, dies 102 may have various configurations and arrangements of components in some applications. For instance, as shown at FIG. 3, dies 102" may include TSVs 114 that are coupled directly to conductive pads 110 on adjacent dies 102 to provide connectivity through to the adjacent bonded die 102. For example, an end surface of the TSV 114 may be exposed at a bonding surface 108 of the die 102", forming a contact surface for bonding to a conductive pad 110 on an adjacent die 102. In other embodiments, as also shown at FIG. 3, the dies 102" may include conductive pads 110 at a bonding surface, with a TSV 114 directly coupled to the conductive pad 110. These conductive pads 110 may be bonded to the conductive pads 110 (or other conductive structures) on an adjacent die 102.

Figure 4:
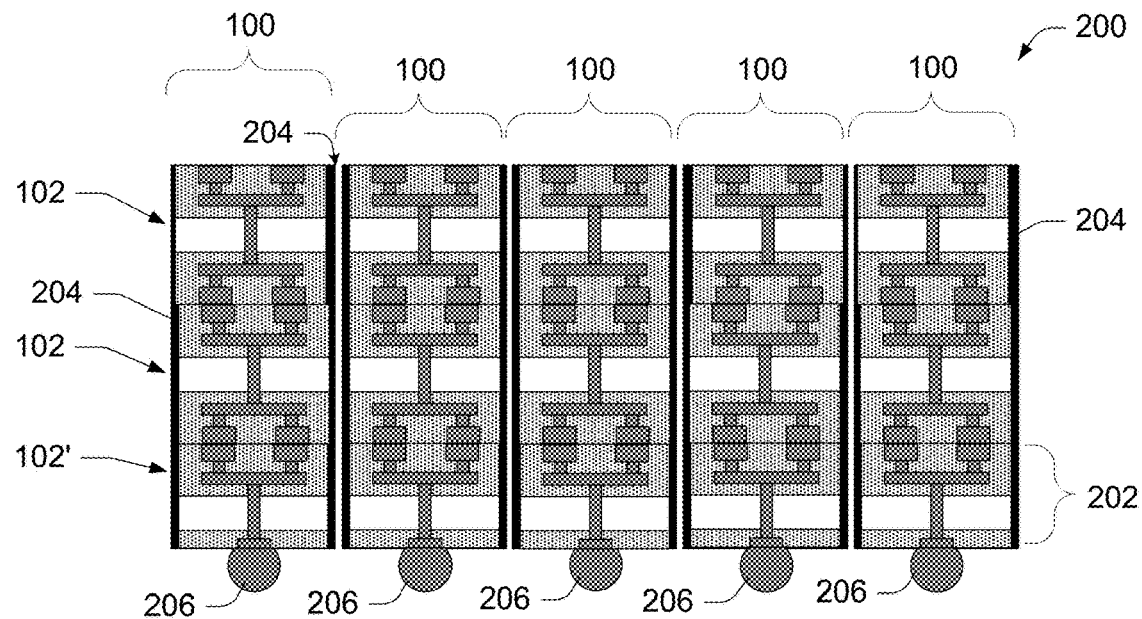
FIG. 4 is a cross-sectional profile view of example die-to-wafer and/or die-to-die stacking and molding, according to an embodiment wherein the top of the stacks is not covered and the molding extends to the bottom of the stack.
Figure 5:
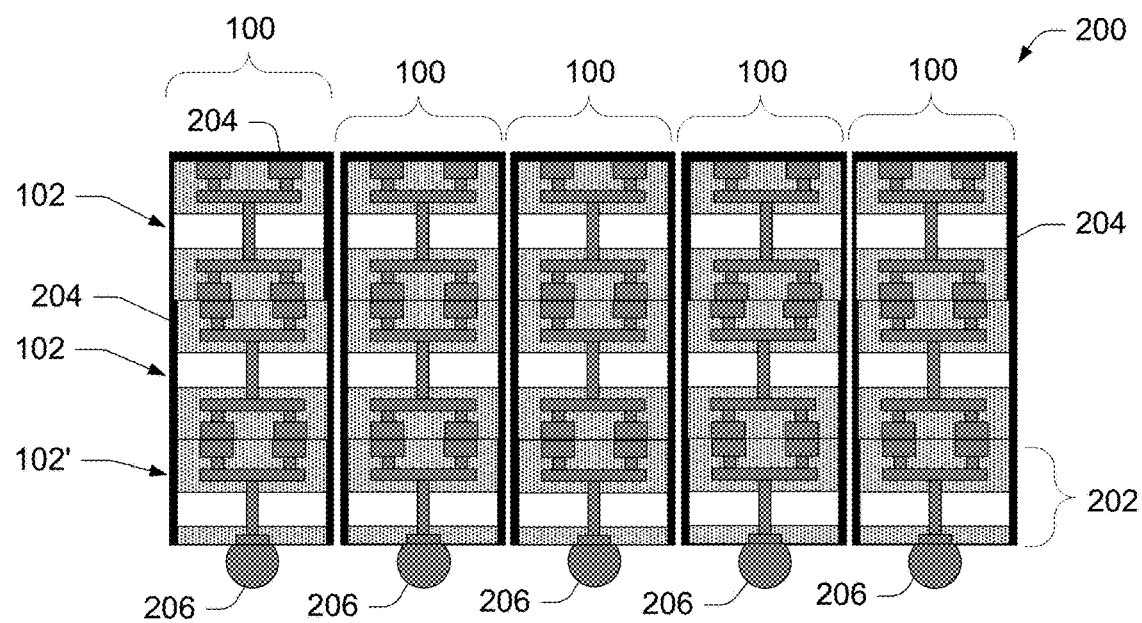
FIG. 5 is a cross-sectional profile view of example die-to-wafer and/or die-to-die stacking and molding, according to an embodiment wherein the top of the stacks is covered and the molding extends to the bottom of the stack.

In an implementation, as shown at FIGS. 4 and 5, the entire stacks 100 may be covered with the molding 204, including the host wafer 202 and dies 102'. In the implementation, the host wafer 202 may be singulated into dies 102' prior to the encapsulating step, facilitating their being covered by molding 204. Multiple dies 102 may be stacked (in groups or one at a time) onto a host die 102' to form a stack 100, which may then be covered with the molding 204. Alternately, the molding 204 may be applied to the assembly 200 after all of the dies 102 are stacked and bonded into stacks 100. Molding 204 can be present on the sides of the stacks 100 in any case. Further, the stacks 100 of the assembly 200 may be separated from each other after the molding step in alternate embodiments.

As shown, FIG. 4 illustrates an example assembly 200 where the top surface (i.e, back) of the assembly 200 and the stacks 100 is free from molding 204. In an embodiment, the molding 204 may be deposited over the assembly 200, and then removed from the top surface of the stacks 100. In various examples, the molding 204 may be removed from the top surface of the stacks 100 to provide for interconnection to the top dies 102, for improved thermal dissipation, or the like. FIG. 5 illustrates the case where the top surface (i.e., back) is covered with the molding 204.

Figure 6:
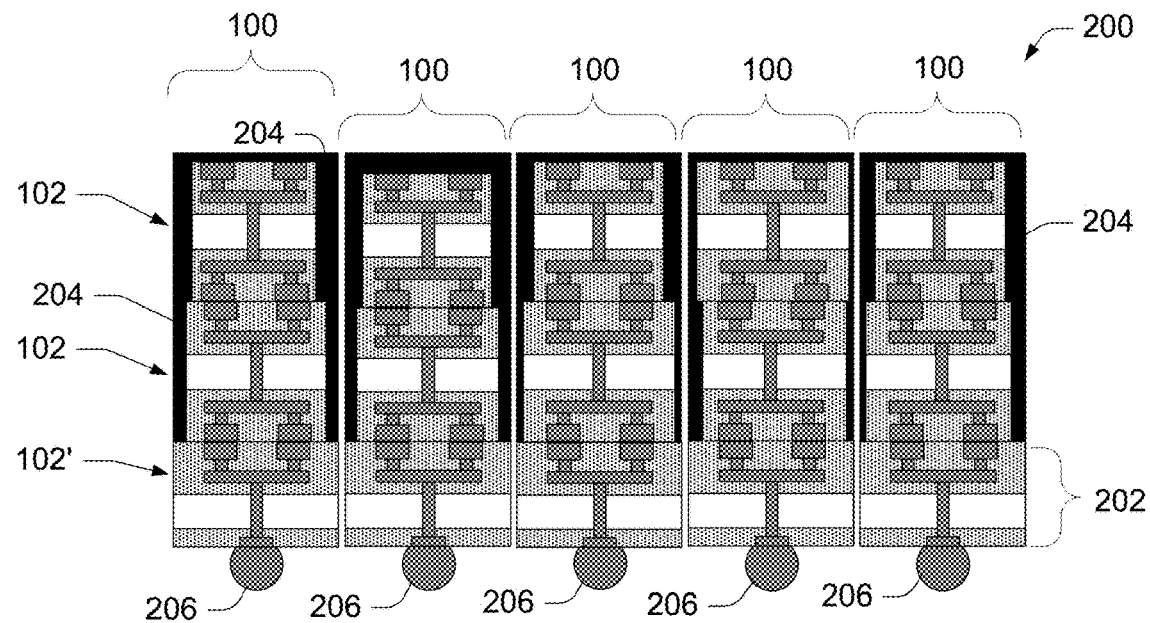
FIG. 6 is a cross-sectional profile view of example die-to-wafer and/or die-to-die stacking and molding with unequal sized dies, according to an embodiment wherein the top of the stacks is covered.
Figure 7:
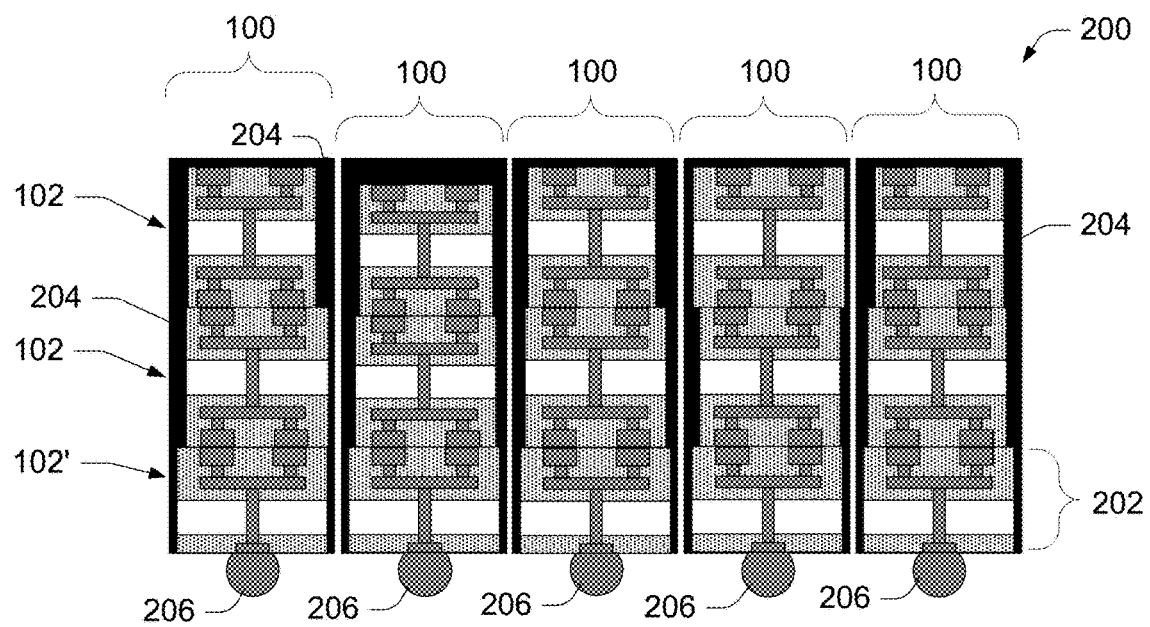
FIG. 7 is a cross-sectional profile view of example die-to-wafer and/or die-to-die stacking and molding with unequal sized dies, according to an embodiment wherein the top of the stacks is covered and the molding extends to the bottom of the stack.

As shown in FIGS. 6 and 7, the dies 102 of the stacks 100 may not be uniform in size (e.g., dimensions, area, footprint, thickness, etc.). Dies 102 with different footprints or thicknesses, for example, may be stacked and bonded to form the stacks 100. Without the molding 204, the stack 100 of non-uniform dies 102 presents uneven side edges and/or stacks 100 of different heights. Covering the stacks 100 with molding 204 can present a uniform package (in side edges/ surfaces as well as height) as stacks 100 and/or an assembly 200.

The example illustrated at FIG. 6 shows an embodiment where the dies 102 are covered with the molding 204, but the host wafer (host dies 102') is not covered with the molding 204. In some embodiments, the thickness of the mold layer 204 on the side edges of the top die 102 is thicker than the thickness of the mold layer 204 disposed on the side edges of the second die 102 beneath. The example of FIG. 7 shows an embodiment where the dies 102 and the host dies 102' are all covered with the molding 204, as discussed above.

Figure 8:
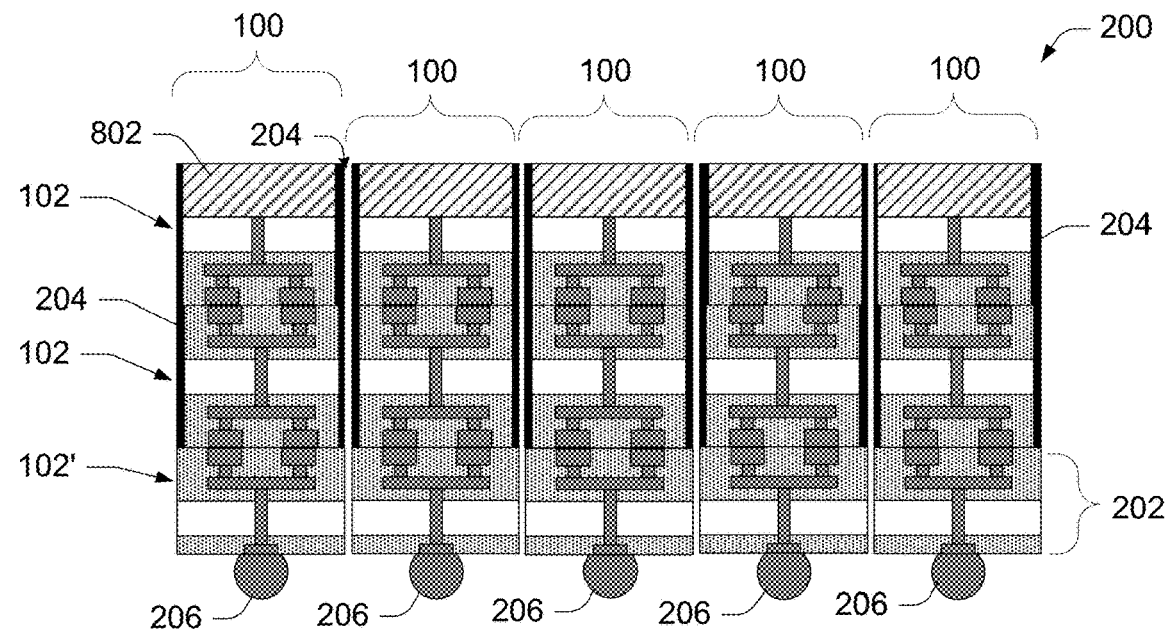
FIG. 8 is a cross-sectional profile view of example die-to-wafer and/or die-to-die stacking and molding, according to an embodiment wherein the top dies of the stacks do not have an interconnection on one side.
Figure 9:
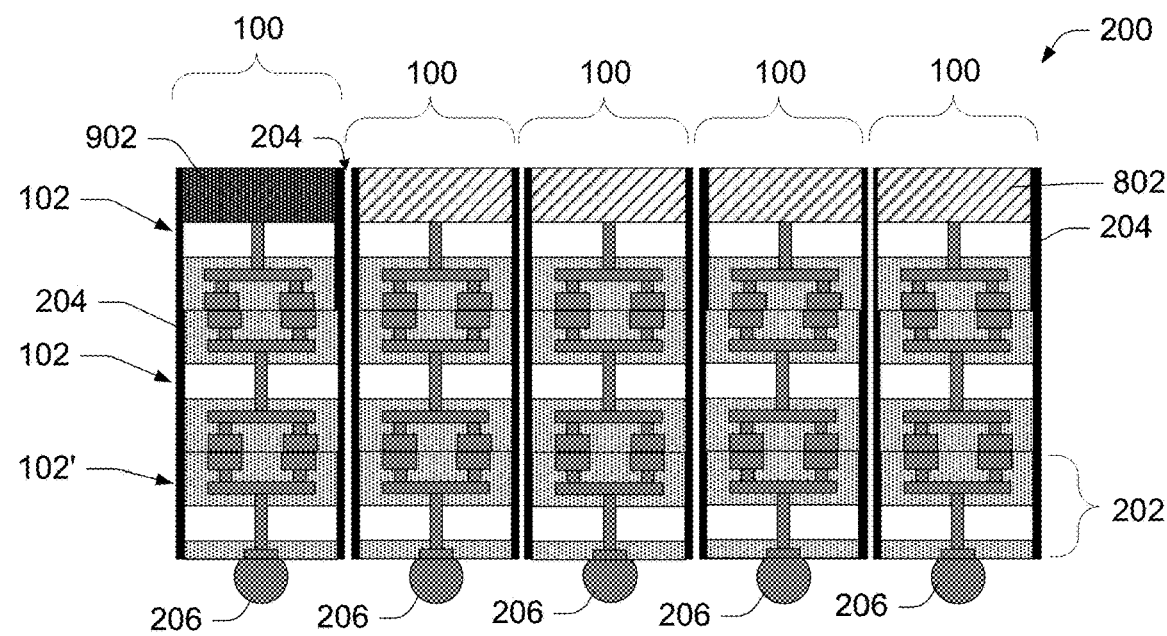
FIG. 9 is a cross-sectional profile view of example die-to-wafer and/or die-to-die stacking and molding, according to an embodiment wherein the top dies of the stacks do not have an interconnection on one side and the molding extends to the bottom of the stack.

As shown at FIGS. 8 and 9, in some implementations, the stacks 100 may include dies 102 with interconnections on one side and not the other. For instance, as shown in the illustrations, the top dies 102 may not have interconnections to the top surface of the die 102. In such cases, no interconnection may be desired on the top (e.g., back) surface of the stacks 100 or assembly 200. In alternate embodiments, other dies 102 may include interconnections on one side only. In some embodiments, the TSV 114 is also optional for the top die 102, however, the TSV 114 may be used for thermal dissipation.

In some examples, as shown at FIGS. 8 and 9, a heat sink 802 or other component 902 (e.g., sensor, optical component, etc.) may be included in a stack 100. For instance, a heat sink 802 may be located at the top of the stack 100 to assist in dissipating heat from one or more dies 102 of the stack 100 into the environment. In some cases, thermally conductive TSVs 114 may help to transport excess heat from some dies 102 to other dies 102 and to the heat sink 802. In alternate embodiments, the heat sink 802 or other component 902 may be located somewhere within the stack 100 or at the bottom of the stack 100 as desired for its application and performance.

As shown at FIGS. 8 and 9, when a heat sink 802 or other component 902 is located at the top of the stack 100, the top of the stack 100 (e.g., the top or "back" surface of the die 102) may be free from molding 204. In some cases, some of the stacks 100 of an assembly 200 may include molding 204 all around the stack 100 and including at the top surface of the stack 100, while other stacks 100 (for instance stacks 100 that include a heat sink 802 or other component 902) may be free of molding 204 at the top surface, while having molding 204 at the sides of the stack 100.

Figure 10:
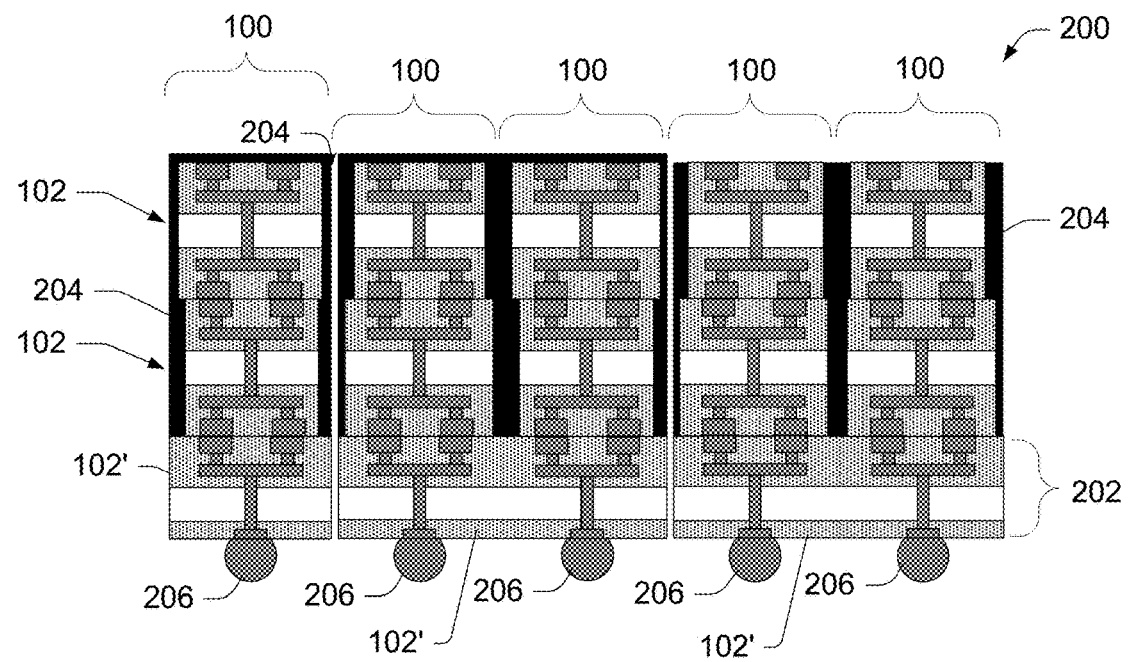
FIG. 10 is a cross-sectional profile view of example die-to-wafer and/or die-to-die stacking and molding, including some lateral placement of dies on a single level, according to an embodiment.
Figure 11:
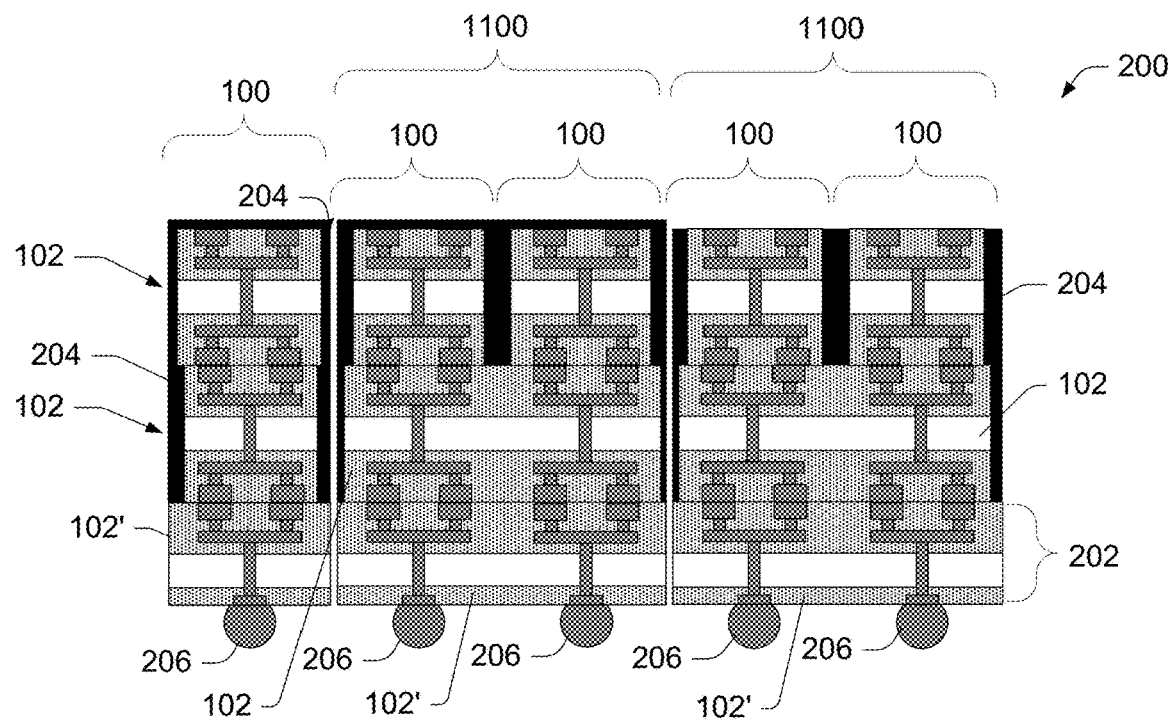
FIG. 11 is a cross-sectional profile view of example die-to-wafer and/or die-to-die stacking and molding, including some lateral placement of dies and wafers on a single level, according to an embodiment.

As shown at FIGS. 10 and 11, in some embodiments, uniform and/or non-uniform dies 102 may be stacked and bonded to form stacks 100, where multiple dies 102 are placed laterally on a single level within the assembly 200 package. For instance, as shown at FIG. 10, the host wafer 202 may not be singulated at each of the stacks 100. Consequently, more than one stack 100 may be bonded to a single host die 102'. For instance, in the example of FIG. 10, the second and third stacks 100 are bonded to a single host die 102' and the fourth and fifth stacks 100 are bonded to another host die 102'.

As shown at FIG. 10, the groups of stacks 100 bonded to a host die 102' may be covered in molding 204 together. For instance, in the example, the second and third stacks 100 may be covered in molding 204 together (e.g., commonly encapsulated) and the fourth and fifth stacks 100 may be covered in molding 204 together (e.g., commonly encapsulated). Alternately or in combination, the molding 204 of some groups of stacks 100 bonded to a common host die 102' may be separated, with separate molding 204 around each stack 100 individually. The host dies 102' (or wafer) may be free from molding, as shown in the example. Alternately, the host dies 102' (or wafer) may be covered with molding 204.

As shown at FIG. 11, in some embodiments, additional dies 102 may be stacked in a lateral arrangement on a single level of the assembly 200, forming one or more common stacks or partially common stacks 1100. For instance, FIG. 11 shows an example of partially common stacks 1100. In the example, the first row of dies 102 that are bonded to the host dies 102' may not be singulated at each of the stacks 100. Consequently, more than one stack 100 may be bonded to a single host die 102' and a single "first row" die 102.

For instance, in the example of FIG. 11, the second and third stacks 100 comprise a single first row die 102 bonded to a single host die 102'. The subsequent rows of dies 102 of the second and third stacks 100 are bonded to the single first row die 102. Accordingly, the second and third stacks 100 share a common host die 102' and a common first row die 102. When some dies 102 are common to multiple stacks 100, this results in a partially common stack 1100. In other embodiments, additional rows of dies 102 may be common to the second and third stacks 100. For example, if the dies 102 of all rows of multiple stacks 100 are common to the multiple stacks 100, this would result in a common stack 1100.

As shown in FIG. 11, the fourth and fifth stacks 100 also comprise a single first row die 102 bonded to a single host die 102'. The subsequent rows of dies 102 of the fourth and fifth stacks 100 are bonded to the single first row die 102. Accordingly, the fourth and fifth stacks 100 share a common host die 102' and a common first row die 102, resulting in a partially common stack 1100.

As shown at FIGS. 10 and 11, the first stack 100 is covered with molding 204 (except for the host die 102'), and each of the partially common stacks 1100 are also covered with molding 204 (except for the host die 102'). However, as shown at FIGS. 10 and 11, one or more partially common stacks 1100 may include molding 204 at the top surface of the dies 102 of the partially common stack 1100 and one or more partially common stacks 1100 may be free of molding 204 at the top surface of the dies 102 of the partially common stack 1100. As discussed above, removing the molding 204 (or not depositing the molding 204) at the top surface of the top dies 102 can allow interconnectivity with the top dies 102, can allow for improved heat dissipation from the top dies 102, and so forth.

Additional Embodiments

Figure 12:
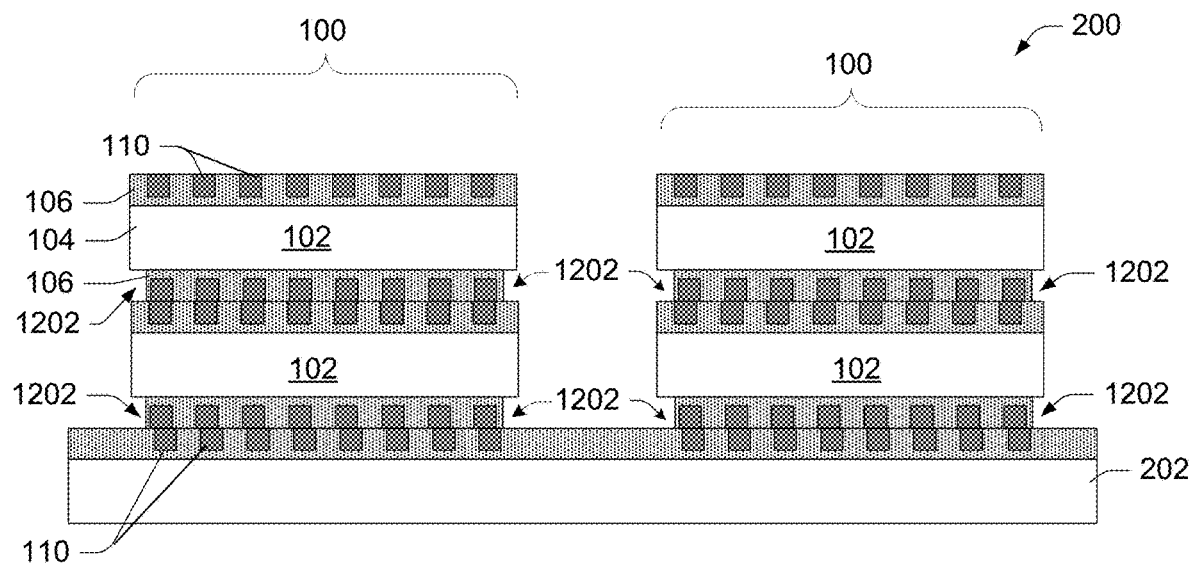
FIG. 12 is a cross-sectional profile view of example die-to-wafer and/or die-to-die stacking including some etching of die edges, according to an embodiment.
Figure 13:
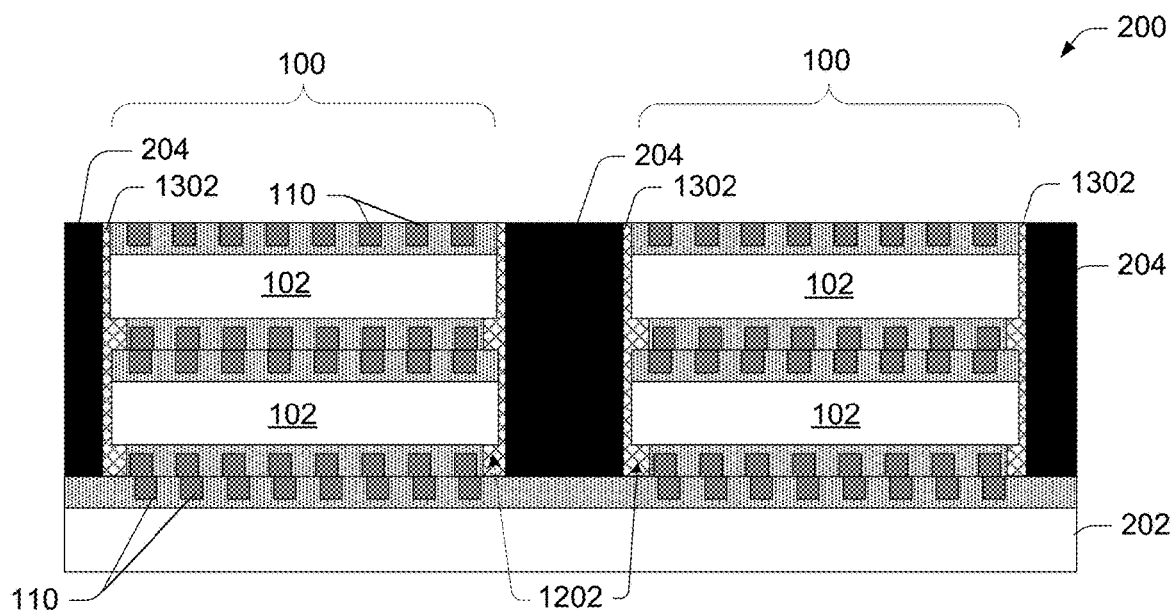
FIG. 13 is a cross-sectional profile view of example die-to-wafer and/or die-to-die stacking and molding including some etching of die edges, according to an embodiment.

FIGS. 12 and 13 illustrate example embodiments of an assembly 200 where one or more stacks 100 of bonded dies 102 are bonded to a host wafer 202. In some examples, the host wafer 202 may be singulated into host dies 102' (not shown). In various embodiments as shown, the dies 102 may be double-sided dies with conductive features 110 embedded within insulating layers 106 on either side of a base layer 104. Some details, such as traces 112 and TSVs 114 can be assumed to be present in some embodiments, but are not illustrated, for clarity of the figures.

In an implementation, as shown at FIGS. 12 and 13, one or more of the insulating layers 106 may be etched (see 1202) at the perimeter edge of the dies 102, removing some of the insulating layer 106 at the perimeter. The perimeter etching 1202 may be intentional, based on a specification for the device, the package, the processing, or the like. In the implementation, the etching 1202 may be present on one or more sides or edges of the dies 102. In some cases, the etching 1202 comprises removal of a portion of the insulating layer 106 at the perimeter and exposing the base layer 104 below. In other cases, the etching 1202 does not expose the base layer 104 or the etching 1202 also removes some of the base layer 104 as well.

Figure 14:
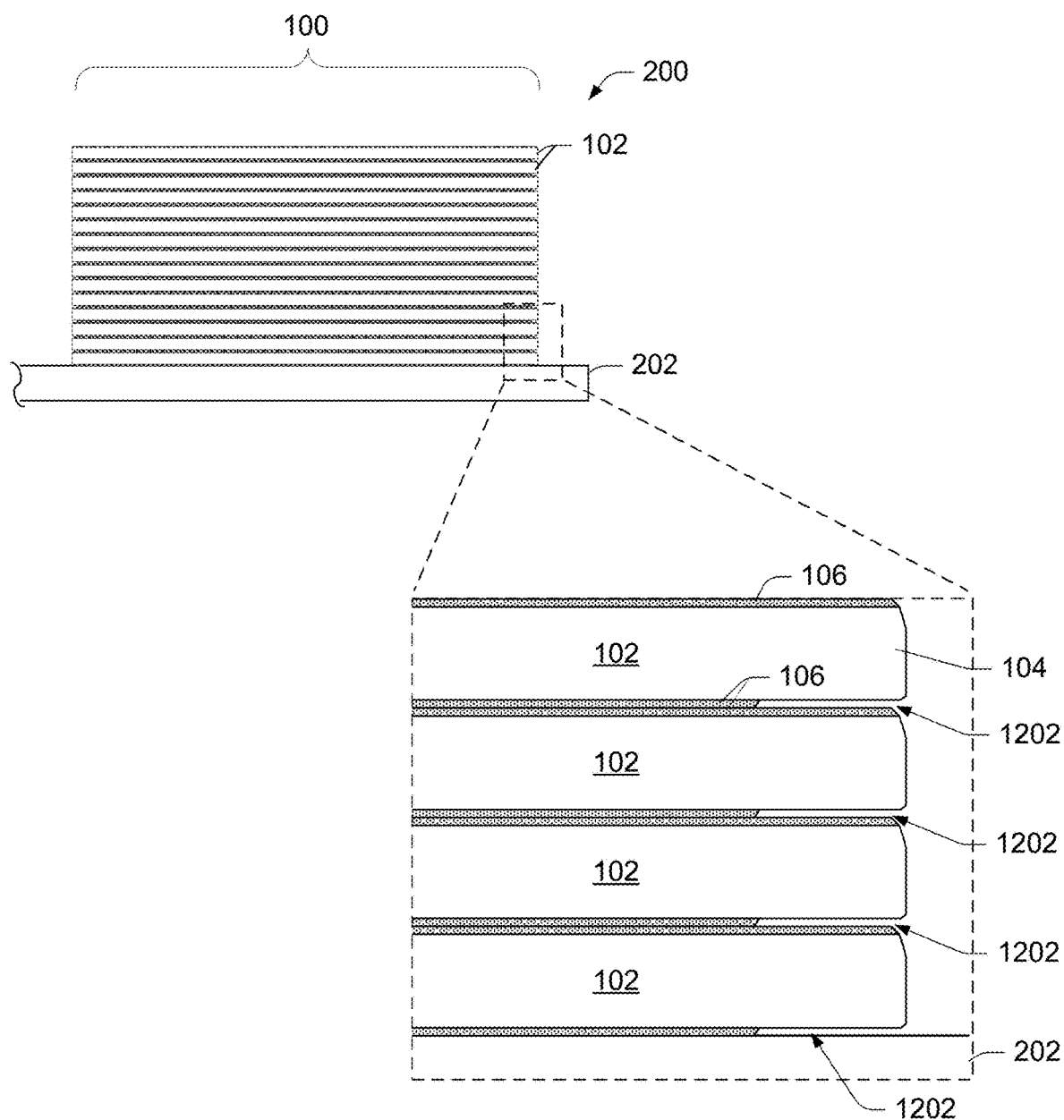
FIG. 14 is a cross-sectional profile view of example die-to-wafer and/or die-to-die hybrid bond stacking, including some etching of die edges, according to another embodiment.

FIG. 14 is an additional illustration of dies 102 with etched perimeter edges (recesses 1202), according to an embodiment. The illustration of FIG. 14 more closely shows the relative scale of the recesses 1202 with respect to the base layer 104 and the insulating layers 106, in an example embodiment. In other embodiments, other proportions may be present.

In some cases, molding 204 compound may be filled with particles, as discussed above. For instance, the particles may be added to the molding 204 to change a coefficient of thermal expansion (CTE) of the molding 204. This can assist in reducing package warpage, for instance, by balancing the CTE across the package (e.g., assembly 200). However, in some instances, the particles in the molding 204 may be too large to fit within the smaller recesses 1202 formed by the perimeter etching. Any voids left behind after the molding 204 is applied to the stacks 100 could cause "popcorn" failure in assembly of the package (e.g., assembly 200).

Rather than not include the particles in the molding 204 (and not receive the benefits of doing so), in various implementations, as shown at FIG. 13, multiple layers of molding 204 may be used to mitigate possible failures. For instance, a first low viscosity compound 1302 may be applied around the stacks 100, forming a layer of compound 1302 around the stacks 100 and penetrating the etched recesses 1202. The layer 1302 can then be followed by a layer of the molding 204.

In the implementations, the first layer compound 1302 may not include a filler or particles. For instance, having a low viscosity, the primary purpose of the compound 1302 may be to fill the etched recesses 1302 in the dies 102. However, the compound 1302 may also form a layer over the vertical wall of the dies 102 of the stack 100. After applying the first layer compound 1302, the stacks 100 and/or the assembly 200 may be covered with the molding 204. In alternate embodiments, additional layers may also be used to cover the stacks 100 and/or the assembly 200.

In other implementations, the first layer (low viscosity) compound 1302 (or resin) may include sub-micron particles or even nano particles sufficiently small to be incorporated within the recess 1202. The sub-micron or nano particles may be comprised of silica, silicon, a silica/silicon compound, or the like. Nano particles may average 20 nm in size (e.g., diameter) in some cases, and may be smaller or larger in other cases.

In an embodiment, the first layer compound 1302 (with sub-micron or nano-sized filler particles) forms a layer over the vertical wall of dies 102 and the recess 1202. In some embodiments, it is preferable that the sub-micron or nanoparticles content of the first layer compound 1302 be more than 5%. The molding layer 204 typically comprises reinforcing particulate with a particulate content typically greater than 50%, and it may be preferable that the particulate content of the mold layer 204 be higher than the particulate content of the first layer compound 1302 within the recess 1202. Similarly, in some applications, it may be preferable that the nominal size of the particulates in the mold layer 204 be larger than the nominal size of the particulates in the first layer compound 1302.

Figure 15:
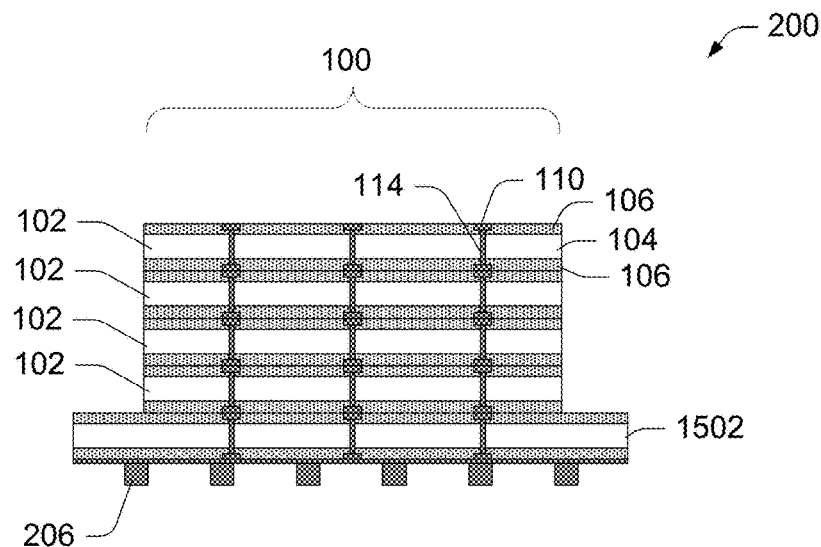
FIG. 15 is a cross-sectional profile view of example die-to-wafer and/or die-to-die memory stacking, according to an embodiment.
Figure 16:
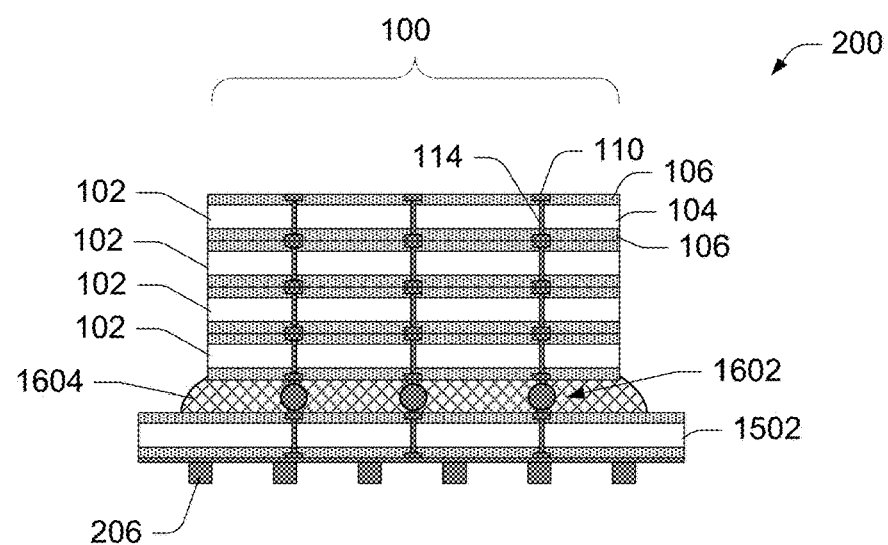
FIG. 16 is a cross-sectional profile view of example die-to-wafer and/or die-to-die hybrid bond stacking, including flip chip terminations, according to an embodiment.

Referring to FIGS. 15 and 16, in common practice, memory dies are coupled to other memory dies using ball-grid arrays (BGA) and other similar technologies. In those cases, memory die to memory die pitch is often about 45 microns. Using similar technology, logic die to interposer pitch is about 90-100 microns. However, in some embodiments, it can be possible and practical to assemble a memory die stack (such as a stack 100) separately at a finer pitch, and stack it on a logic die afterwards. Note that in some cases, the logic die may not be larger than a memory die.

FIGS. 15 and 16 show examples of a "high bandwidth memory" assembly 200, including a stack 100 of memory dies 102 (e.g., dynamic random access memory (DRAM), static random access memory (SRAM), flash memory, etc.) coupled to a logic die 1502. In various implementations, the dies 102 are hybrid bonded (DBI®) to form the stack 100, as discussed above. As shown in FIG. 15, the stack 100 (or the bottom die 102) may be hybrid bonded to the logic die 1502. The logic die 1502 may include terminals 206 for coupling the assembly 200 to a circuit, PCB, device, or the like, as discussed above. Using a direct or hybrid bonding technology, the distance between dies 102 and between dies 102 and the logic die 1502 is greatly reduced (due to the die thickness vs current technology, the distance is the die thickness plus the Cu pillar and solder ball height). In one embodiment, circuit elements (such as conductive features 110, or the like) at the bonding surface of one or more of the bonded dies 102 is less than 20 microns and in other applications less than 5 microns or even less than 1 micron.

As shown in FIG. 16, the stack 100 may alternately be coupled to the logic die 1502 using flip-chip technology, or the like. For instance, flip-chip terminals 1602 may be coupled to the bottom side of the bottom die 102, which interface with terminals 1602 at the top surface of the logic die 1502. Accordingly, a combination of hybrid bonding and flip-chip technology may be used with the assembly 200. In alternate embodiments, other coupling technologies may also be used to couple a hybrid bonded stack 100 to a logic die 1502, an interposer, or the like, if desired.

Also shown in FIG. 16 is a molding 1604, which covers the flip-chip terminals 1602 and fills in the gap between the stack 100 and the logic die 1502. In some embodiments, the assembly 200 may also be covered with a molding 204, if desired for handling, packaging, and so forth.

FIGS. 17-20 show additional implementations that use a stack 100 and/or an assembly 200 in various applications. For instance, at FIG. 17 an assembly 1700 is shown that includes various dies 102, including a stack 100 of dies 102, hybrid bonded to an interposer 1702. In an embodiment, the interposer 1702 is comprised of a semiconductor such as silicon, for example. The drawing is simplified for clarity.

Figure 17:
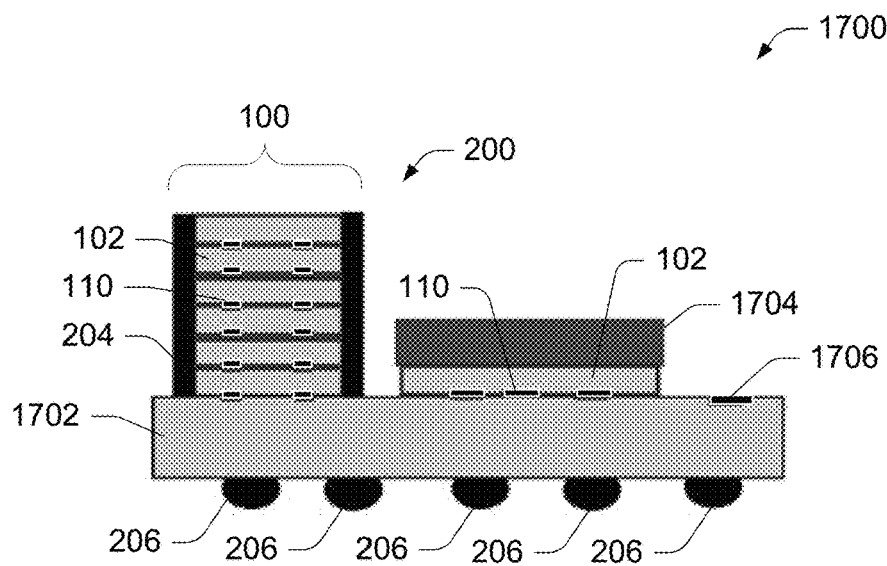
FIGS. 17-20 show cross-sectional profile views of example die-to-wafer and/or die-to-die hybrid bond stacking, including various combinations on a substrate, according to various embodiments.

In various embodiments, as shown at FIG. 17, some dies 102 may be molded and other dies 102 may not be molded. A heat sink or other cooling device 1704 (e.g., fan, etc.) is coupled to an unmolded die 102 to cool the die 102 (which may comprise a high power component, such as a processor, or the like). The interposer 1702 includes hybrid bonding pads 110 as well as at least one wirebond pad 1706.

Figure 18:
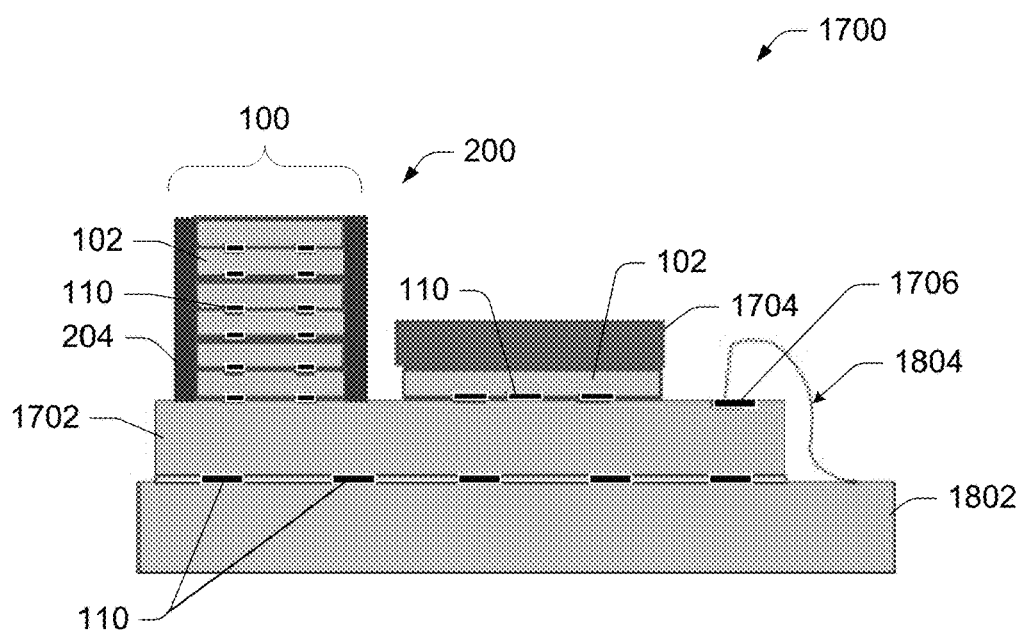

As shown in FIG. 18, a wirebond pad 1706 may be used to couple a remote component (for instance a component coupled to (or through) or integral to the laminate 1802) to the pad 1706 via a wire 1804. In an embodiment as shown, the laminate 1802 is hybrid bonded to the interposer 1702. Alternately, the laminate 1802 may be coupled to the interposer 1702 with another bonding technology.

Figure 19:
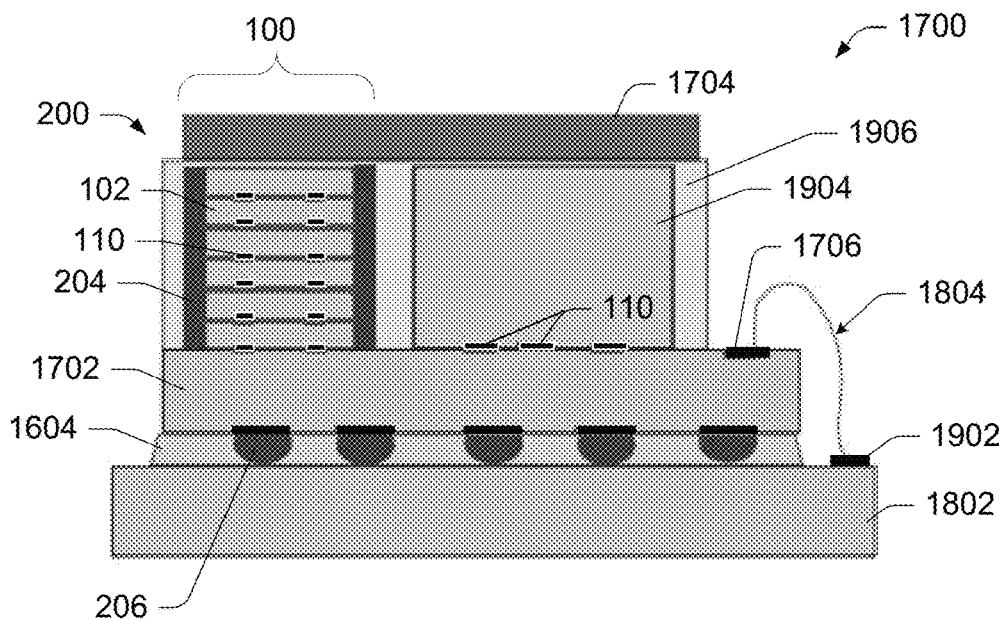

For example, as shown in FIG. 19, the laminate 1802 may be coupled to the interposer 1702 with BGA technology, another surface-mount technology, or the like. In an implementation, as shown at FIG. 19, the laminate 1802 may include one or more wirebond pads 1902, which may be used with a wire 1804 to couple to a wirebond pad 1706, or the like.

In an embodiment, as shown at FIG. 19, the assembly 200 or the stack 100 may be packaged with another component 1904, which may be hybrid bonded to the interposer 1702. The component 1904 and the assembly 200 or the stack 100 may be covered in a molding 1906, comprising an encapsulant (or other package) if desired. The package or the stack 100 and component 1904 may be hybrid bonded to the interposer 1702. A cooling device 1704 may be coupled to the component 1904 and/or the stack 100, as shown in FIG. 19. Additionally, a fill 1604 may be used to cover the terminals 206 and fill in the gap between the interposer 1702 and the laminate 1802. Alternately, the interposer 1702 may be encapsulated, either with other components or separately.

Figure 20:
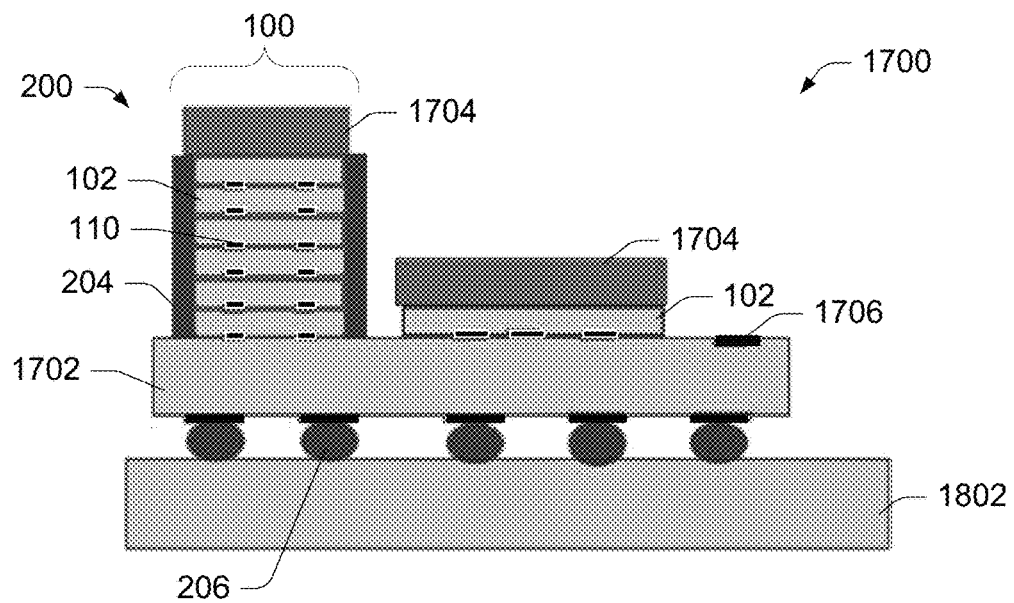

As shown at FIG. 20, the stack 100 may be covered with molding 204, and other dies 102 and/or components may not. A heat sink or other cooling device 1704 (e.g., fan, etc.) is coupled to an unmolded die 102 to cool the die 102 (which may comprise a high power component, such as a processor, or the like). An additional cooling device may also be coupled to the stack 100, which may be free of molding 204 at the top surface of the stack 100. The interposer 1702 includes hybrid bonding pads 110 as well as at least one wirebond pad 1706. As shown, the interposer 1702 may be coupled to the laminate 1802 via a BGA arrangement, or other coupling technology.

Example Process

Figure 21:
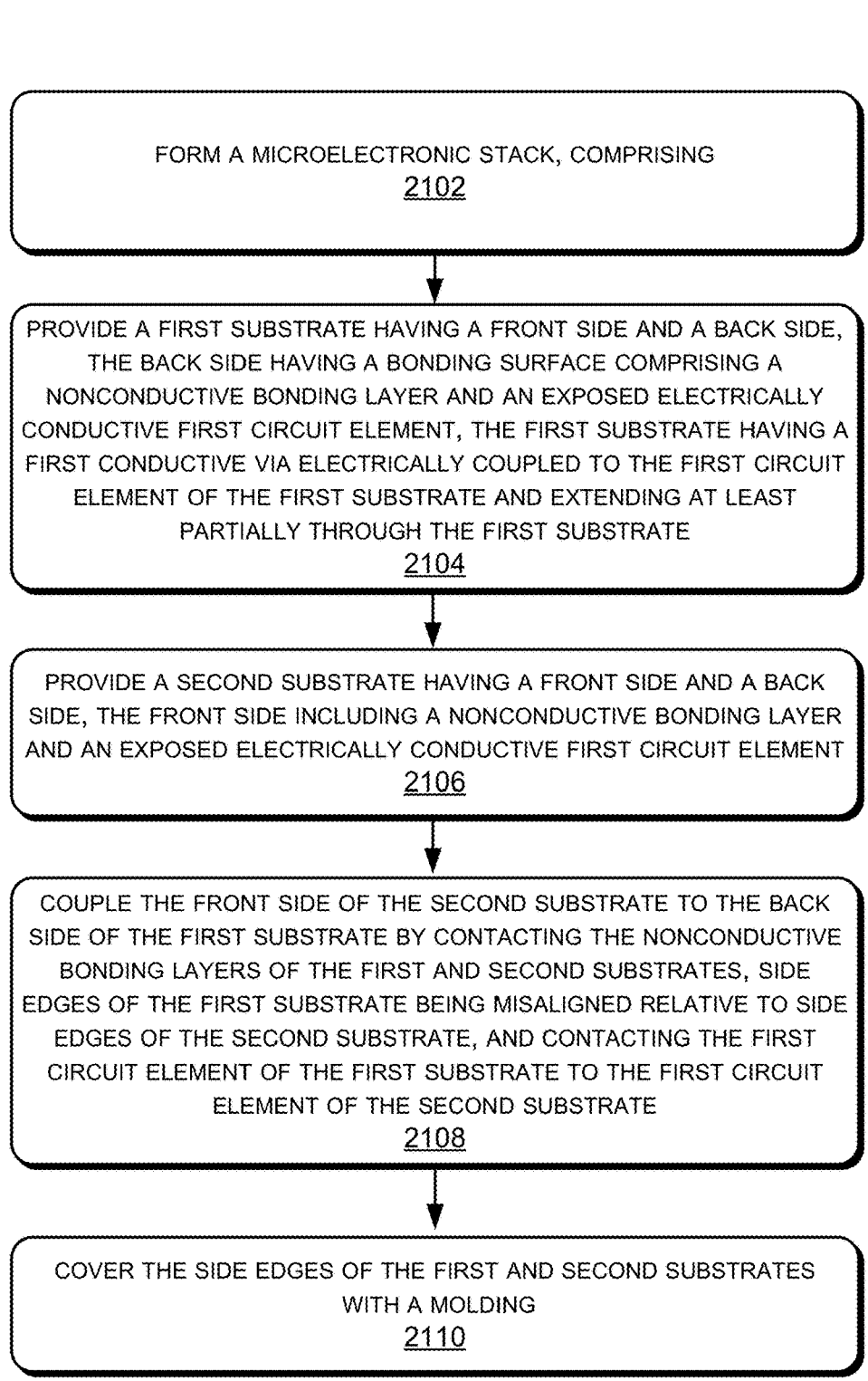
FIG. 21 is a flow diagram illustrating an example process for forming a stacked and bonded structure, according to an embodiment.

FIG. 21 is a flow diagram illustrating an example process 2100 of forming a stacked and bonded microelectronic assembly (such as the microelectronic assembly 200) comprising a stack of dies (such as stack 100 of dies 102, for example). In some embodiments, the stack of dies may be covered with a molding (such as molding 204, for example) for handling, processing, application, and the like. The process 2100 refers to FIGS. 1-20.

The order in which the process is described is not intended to be construed as limiting, and any number of the described process blocks in the process can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein. In alternate implementations, other techniques may be included in the process in various combinations and remain within the scope of the disclosure.

At block 2102, the process includes forming a microelectronic stack (such as stack 100 of dies 102, for example). In an alternate embodiment, the process comprises forming a plurality of the microelectronic stacks. In an implementation, forming the microelectronic stack includes the following blocks:

At block 2104, the process includes providing a first substrate (such as a first die 102, for example) having a front side and a back side. The back side having a bonding surface comprising a nonconductive bonding layer and an exposed electrically conductive first circuit element. The first substrate having a first conductive via electrically coupled to the first circuit element of the first substrate and extending at least partially through the first substrate.

At block 2106, the process includes providing a second substrate having a front side and a back side. The front side including a nonconductive bonding layer and an exposed electrically conductive first circuit element.

At block 2108, the process includes coupling the front side of the second substrate to the back side of the first substrate by contacting the nonconductive bonding layers of the first and second substrates. In an embodiment, side edges of the first substrate are misaligned relative to side edges of the second substrate. The coupling includes contacting the first circuit element of the first substrate to the first circuit element of the second substrate (e.g., hybrid bonding).

At block 2110, the process includes covering the side edges of the first and second substrates with a molding (such as molding 204, for example). In an implementation, the process includes covering the back side of the second substrate with the molding. In various embodiments, the molding includes more than one layer or more than one material or compound. In some embodiments, at least one of a plurality of layers of the molding includes particles to assist in balancing the CTE of the assembly, to avoid warpage of the assembly.

In an embodiment, the back side of the second substrate includes a second nonconductive bonding layer and an exposed electrically conductive second circuit element. In the embodiment, the second substrate has a second conductive via electrically coupling the first and second circuit elements of the second substrate.

In an implementation, the process includes providing a third substrate having a front side and a back side, the front side including a nonconductive bonding layer and an exposed electrically conductive first circuit element. The process includes coupling the front side of the third substrate to the back side of the second substrate by contacting the nonconductive bonding layer of the third substrate to the nonconductive bonding layer of the second substrate. In an embodiment, side edges of the third substrate are misaligned relative to side edges of the second and/or first substrates. The coupling includes contacting the first circuit element of the third substrate to the second circuit element of the second substrate (e.g., hybrid bonding).

In the implementation, the process includes forming a recess at the bonding layer of the first and/or the second substrates at a perimeter of the first and/or the second substrates and filling at least the recess with a low viscosity compound prior to covering the side edges of the first and second substrates with the molding.

In another implementation, the process includes covering the side edges of the third substrate with the molding. In a further implementation, the process includes covering the back side of the third substrate with the molding.

In an implementation, the process includes hybrid bonding the microelectronic stack to a semiconductor interposer having at least one wirebond contact pad. In another implementation, the process includes coupling the interposer to a laminate having a second wirebond contact pad and bonding the at least one wirebond contact pad of the interposer to the second wirebond contact pad of the laminate with a wire. For instance, the interposer may be hybrid bonded to the laminate.

In further implementations, various portions of the microelectronic assembly are covered with one or more layers of molding, while other portions are not.

Although various implementations and examples are discussed herein, further implementations and examples may be possible by combining the features and elements of individual implementations and examples. In various embodiments, some process steps may be modified or eliminated, in comparison to the process steps described herein.

The techniques, components, and devices described herein are not limited to the illustrations of FIGS. 1-21, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A microelectronic assembly, comprising:
a first substrate having a first bonding surface and a first microelectronic circuit element embedded into the first substrate, a portion of the first circuit element of the first substrate exposed at the first bonding surface of the first substrate;
a second substrate having a first bonding surface and a first microelectronic circuit element embedded into the second substrate, a portion of the first circuit element of the second substrate exposed at the first bonding surface of the second substrate, the first bonding surface of the second substrate hybrid bonded to the first bonding surface of the first substrate without adhesive so that the first circuit element of the second substrate is electrically coupled to the first circuit element of the first substrate, wherein side edges of the first substrate are misaligned relative to side edges of the second substrate; and
a multi-layer molding covering the side edges of at least the second substrate, wherein the multi-layer molding comprises a first compound layer having a first coefficient of thermal expansion (CTE) at a perimeter surface of the second substrate and a second compound layer with a CTE different than the first CTE covering over the first compound layer.

2. The microelectronic assembly of claim 1, further comprising a first conductive via electrically coupled to the first circuit element of the first substrate and extending at least partially through the first substrate.

3. The microelectronic assembly of claim 2, wherein the first substrate includes a second surface opposite the first bonding surface, and wherein the first conductive via extends to the second surface of the first substrate and provides electrical connectivity to the second surface of the first substrate from the first bonding surface of the first substrate.

4. The microelectronic assembly of claim 3, further comprising a terminal connection coupled to the second surface of the first substrate and electrically coupled to the first conductive via.

5. The microelectronic assembly of claim 2, wherein the second substrate includes a second bonding surface opposite the first bonding surface and a second microelectronic circuit element embedded into the second substrate, a portion of the second circuit element of the second substrate exposed at the second bonding surface of the second substrate.

6. The microelectronic assembly of claim 5, further comprising a second conductive via electrically coupled to the first and second circuit elements of the second substrate and extending at least partially through the second substrate, the second conductive via provides electrical connectivity to the second bonding surface of the second substrate from the first bonding surface of the second substrate.

7. The microelectronic assembly of claim 6, wherein the second conductive via provides electrical connectivity to the second bonding surface of the second substrate from a second surface of the first substrate opposite the first bonding surface of the first substrate.

8. The microelectronic assembly of claim 6, further comprising a third substrate having a first bonding surface and a first microelectronic circuit element embedded into the third substrate, a portion of the first circuit element of the third substrate exposed at the first bonding surface of the third substrate, the first bonding surface of the third substrate bonded to the second bonding surface of the second substrate so that the first circuit element of the third substrate is electrically coupled to the second circuit element of the second substrate.

9. The microelectronic assembly of claim 8, wherein side edges of the third substrate are misaligned relative to the side edges of the second substrate or the first substrate.

10. The microelectronic assembly of claim 8, wherein the molding covers the side edges of the first, second, and third substrates.

11. A microelectronic assembly comprising a plurality of the microelectronic assemblies of claim 10.

12. The microelectronic assembly of claim 11, wherein a footprint of the first, second, and third substrates is non-uniform and wherein exterior side edges of the molding extending from the first substrate to the third substrate are planar.

13. The microelectronic assembly of claim 8, wherein the molding covers the side edges of the second and third substrates, but not the first substrate.

14. The microelectronic assembly of claim 8, wherein the molding covers a second surface of the third substrate opposite the first bonding surface of the third substrate.

15. The microelectronic assembly of claim 1, wherein the molding covers a second surface of the second substrate opposite the first bonding surface of the first substrate.

16. A microelectronic assembly, comprising:
a plurality of adjacent stacks of multiple microelectronic elements, each stack comprising:
a first substrate having a first bonding surface and a first microelectronic circuit element embedded into the first substrate, a portion of the first circuit element of the first substrate exposed at the first bonding surface of the first substrate and a first conductive via electrically coupled to the first circuit element of the first substrate and extending at least partially through the first substrate;
a second substrate having a first bonding surface and a first microelectronic circuit element embedded into the second substrate, a portion of the first circuit element of the second substrate exposed at the first bonding surface of the second substrate and a second conductive via electrically coupled to the first circuit element of the second substrate and extending at least partially through the second substrate, the first bonding surface of the second substrate hybrid bonded to the first bonding surface of the first substrate without adhesive so that the first circuit element of the second substrate is electrically coupled to the first circuit element of the first substrate, wherein side edges of the first substrate are misaligned relative to side edges of the second substrate; and a molding covering the side edges of at least the second substrate of each stack, including the side edges facing side edges of an adjacent stack.

17. The microelectronic assembly of claim 16, wherein the first substrate includes a second surface opposite the first bonding surface, and wherein the first conductive via extends to the second surface of the first substrate and provides electrical connectivity to the second surface of the first substrate from the first bonding surface of the first substrate.

18. The microelectronic assembly of claim 17, wherein the second substrate includes a second bonding surface opposite the first bonding surface and a second microelectronic circuit element embedded into the second substrate, a portion of the second circuit element of the second substrate exposed at the second bonding surface of the second substrate, and wherein the second conductive via is electrically coupled to the second circuit element of the second substrate.

19. The microelectronic assembly of claim 18, wherein at least one of the first and second bonding surfaces of the second substrate includes an etched portion of a perimeter of the at least one of the first and second bonding surfaces forming an intentional recess at a perimeter edge of the second substrate.

20. The microelectronic assembly of claim 19, wherein the molding comprises a first low viscosity compound without particles, the first low viscosity compound penetrating the recess at the perimeter edge of the second substrate, and a second compound with particles covering over the first low viscosity compound.

21. The microelectronic assembly of claim 16, further comprising a laminate and/or an interposer, and wherein the plurality of molded microelectronic element stacks is hybrid bonded to the laminate or the interposer without an adhesive or an intervening material.

22. The microelectronic assembly of claim 21, further comprising at least one wirebond pad on a surface of the laminate and/or on a surface of the interposer.

23. The microelectronic assembly of claim 21, wherein the laminate is coupled to the interposer using a wire coupled at a wirebond pad on a surface of the laminate and a wirebond pad on a surface of the interposer.

24. The microelectronic assembly of claim 21, further comprising a non-molded die hybrid bonded without adhesive to the laminate and/or the interposer.

25. The microelectronic assembly of claim 16, wherein at least the second substrate comprises a solid-state memory device.

26. A microelectronic assembly, comprising:
a first die having a first bonding surface and a first microelectronic circuit element embedded into the first die, a portion of the first circuit element exposed at the first bonding surface of the first die; and
a second die having a first bonding surface and a first microelectronic circuit element embedded into the second die, a portion of the first circuit element of the second die exposed at the first bonding surface of the second die, the first bonding surface of the first die hybrid bonded to the first bonding surface of the second die, electrically coupling the first die to the second die without an adhesive layer, wherein side edges of the first die comprise a mold layer thinner than a mold layer disposed on side edges of the second die and wherein the mold layer at the first die and/or the mold layer at the second die has a non-uniform density.

27. A microelectronic assembly, comprising:
a first die having a first bonding surface and a first microelectronic circuit element embedded into the first die, a portion of the first circuit element exposed at the first bonding surface of the first die;
a second die having a first bonding surface and a first microelectronic circuit element embedded into the second die, a portion of the first circuit element of the second die exposed at the first bonding surface of the second die, the first bonding surface of the first die hybrid bonded to the first bonding surface of the second die, electrically coupling the first die to the second die without adhesive and forming a stack;
a molding covering side edges of at least the second die; and
a semiconductor interposer having at least one wirebond contact pad, the stack hybrid bonded to the interposer.

28. A method of forming a microelectronic assembly, comprising:
forming a microelectronic stack, comprising:
providing a first substrate having a front side and a back side, the back side having a bonding surface comprising a nonconductive bonding layer and an exposed electrically conductive first circuit element, the first substrate having a first conductive via electrically coupled to the first circuit element of the first substrate and extending at least partially through the first substrate;
providing a second substrate having a front side and a back side, the front side including a nonconductive bonding layer and an exposed electrically conductive first circuit element;
coupling the front side of the second substrate to the back side of the first substrate by contacting the nonconductive bonding layers of the first and second substrates, side edges of the first substrate being misaligned relative to side edges of the second substrate, and contacting the first circuit element of the first substrate to the first circuit element of the second substrate; and
covering the side edges of at least the second substrate with a multi-layer molding, the multi-layer molding including a first compound layer with a first particle content per volume at a perimeter surface of the second substrate and a second compound layer with a particle content per volume greater than the first particle content per volume covering over the first compound layer.

29. The method of claim 28, further comprising covering the back side of the second substrate with the molding.

30. The method of claim 28, wherein the back side of the second substrate includes a second nonconductive bonding layer and an exposed electrically conductive second circuit element, the second substrate having a second conductive via electrically coupling the first and second circuit elements of the second substrate.

31. The method of claim 30, further comprising:
providing a third substrate having a front side and a back side, the front side including a nonconductive bonding layer and an exposed electrically conductive first circuit element;
coupling the front side of the third substrate to the back side of the second substrate by contacting the nonconductive bonding layer of the third substrate to the nonconductive bonding layer of the second substrate, side edges of the third substrate being misaligned relative to side edges of the second and/or first substrates, and contacting the first circuit element of the third substrate to the second circuit element of the second substrate; and
covering the side edges of the third substrate with the molding.

32. The method of claim 28, further comprising forming a recess at the bonding layer of the first and/or the second substrates at a perimeter of the first and/or the second substrates and filling at least the recess with a low viscosity compound prior to covering the side edges of the first and second substrates with the molding.

33. The method of claim 28, further comprising hybrid bonding the microelectronic stack to a semiconductor interposer having at least one wirebond contact pad.

34. The method of claim 33, further comprising coupling the interposer to a laminate having a second wirebond contact pad and bonding the at least one wirebond contact pad of the interposer to the second wirebond contact pad of the laminate with a wire.

35. The method of claim 28, wherein forming the microelectronic assembly comprises forming a plurality of the microelectronic stacks.

* * * * *